United States Patent
Aspar

(10) Patent No.: US 8,298,915 B2
(45) Date of Patent: Oct. 30, 2012

(54) METHOD OF TRANSFERRING A CIRCUIT ONTO A GROUND PLANE

(75) Inventor: Bernard Aspar, Rives (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 366 days.

(21) Appl. No.: 11/793,863

(22) PCT Filed: Dec. 22, 2005

(86) PCT No.: PCT/FR2005/051139
§ 371 (c)(1),
(2), (4) Date: Jun. 21, 2007

(87) PCT Pub. No.: WO2006/070167
PCT Pub. Date: Jul. 6, 2006

(65) Prior Publication Data
US 2008/0128868 A1    Jun. 5, 2008

(30) Foreign Application Priority Data

Dec. 24, 2004 (FR) ..................... 04 53229

(51) Int. Cl.
*H01L 21/46* (2006.01)
(52) U.S. Cl. . 438/458; 257/347; 257/629; 257/E21.482; 257/E21.569; 438/506; 438/507
(58) Field of Classification Search ............... 438/458, 438/506–507, 455, 691; 257/347, 629
See application file for complete search history.

(56) References Cited

U.S. PATENT DOCUMENTS

| | | | | |
|---|---|---|---|---|
| 3,922,705 A * | 11/1975 | Yerman | ............................. | 338/4 |
| 5,034,343 A * | 7/1991 | Rouse et al. | .................. | 438/400 |
| 5,276,338 A * | 1/1994 | Beyer et al. | ..................... | 257/52 |
| 5,391,257 A | 2/1995 | Sullivan et al. | ............... | 156/630 |
| 5,426,072 A * | 6/1995 | Finnila | .......................... | 438/107 |
| 5,436,173 A * | 7/1995 | Houston | ....................... | 438/155 |
| 5,455,202 A * | 10/1995 | Malloy et al. | ................. | 438/118 |

(Continued)

FOREIGN PATENT DOCUMENTS

EP    0553853 A2    8/1993

(Continued)

OTHER PUBLICATIONS

International Search Report, PCT/FR2005/051139, 3 pgs, (Dec. 22, 2005).

(Continued)

*Primary Examiner* — A. Sefe
(74) *Attorney, Agent, or Firm* — Nixon Peabody LLP

(57) ABSTRACT

Method for forming a semi-conducting structure includes the formation of at least one part of a circuit or a component, in or on a superficial layer of a substrate, the substrate including a buried layer underneath the superficial layer, and an underlying layer serving as first support, a transfer of said substrate onto a handle substrate, and then an elimination of the first support, the formation of an electrically conducting or ground plane forming layer, on at least one part of said buried layer, the formation, on said electrically conducting or ground plane forming layer, of a bonding layer, a transfer of the structure obtained onto a second support and an elimination of said handle substrate.

26 Claims, 5 Drawing Sheets

U.S. PATENT DOCUMENTS

| | | | |
|---|---|---|---|
| 5,591,678 A * | 1/1997 | Bendik et al. | 438/459 |
| 5,777,365 A | 7/1998 | Yamaguchi et al. | |
| 5,849,627 A * | 12/1998 | Linn et al. | 438/455 |
| 6,118,152 A | 9/2000 | Yamaguchi et al. | |
| 6,191,007 B1 * | 2/2001 | Matsui et al. | 438/459 |
| 6,429,094 B1 * | 8/2002 | Maleville et al. | 438/455 |
| 6,465,327 B1 * | 10/2002 | Aspar et al. | 438/458 |
| 6,482,725 B1 * | 11/2002 | Ishida | 438/528 |
| 6,531,753 B1 | 3/2003 | Lin | |
| 6,534,382 B1 * | 3/2003 | Sakaguchi et al. | 438/455 |
| 6,627,953 B1 * | 9/2003 | Vu et al. | 257/347 |
| 6,759,282 B2 * | 7/2004 | Campbell et al. | 438/149 |
| 7,449,718 B2 * | 11/2008 | Nishi et al. | 257/59 |
| 7,504,277 B2 * | 3/2009 | Fletcher et al. | 438/57 |
| 7,713,369 B2 | 5/2010 | Aspar et al. | |
| 2001/0033030 A1 * | 10/2001 | Leedy | 257/777 |
| 2003/0077885 A1 * | 4/2003 | Aspar et al. | 438/517 |
| 2003/0162367 A1 | 8/2003 | Roche | |
| 2003/0219959 A1 * | 11/2003 | Ghyselen et al. | 438/458 |
| 2004/0067622 A1 * | 4/2004 | Akatsu et al. | 438/459 |
| 2004/0222500 A1 * | 11/2004 | Aspar et al. | 257/629 |
| 2004/0241958 A1 * | 12/2004 | Guarini et al. | 438/455 |
| 2005/0020029 A1 * | 1/2005 | Danel | 438/455 |
| 2005/0104067 A1 | 5/2005 | Chu et al. | |
| 2005/0258489 A9 * | 11/2005 | Joly et al. | 257/349 |
| 2006/0057836 A1 * | 3/2006 | Nagarajan et al. | 438/622 |
| 2007/0072391 A1 * | 3/2007 | Pocas et al. | 438/455 |
| 2007/0269960 A1 * | 11/2007 | Letertre et al. | 438/458 |
| 2008/0041517 A1 * | 2/2008 | Moriceau et al. | 156/182 |
| 2008/0254596 A1 * | 10/2008 | Aspar et al. | 438/459 |
| 2009/0091014 A1 * | 4/2009 | Yamazaki et al. | 257/678 |
| 2011/0018132 A1 * | 1/2011 | Rey et al. | 257/739 |

FOREIGN PATENT DOCUMENTS

| | | |
|---|---|---|
| EP | 0553853 A3 | 9/1997 |
| JP | 4-177876 | 6/1992 |
| JP | 9-97832 | 4/1997 |
| JP | 11-195712 | 7/1999 |
| JP | 2004-535664 | 11/2004 |
| WO | WO 0233746 A1 | 4/2002 |
| WO | 02/084721 A2 | 10/2002 |
| WO | 02/084721 A3 | 10/2002 |

OTHER PUBLICATIONS

Office Action for Japanese Patent Application No. 2007-547604, issued Jul. 12, 2011.

Office Action for Japanese Patent Application No. 2007-547604, issued Feb. 21, 2012.

* cited by examiner

METHOD OF TRANSFERRING A CIRCUIT ONTO A GROUND PLANE

CROSS REFERENCE TO RELATED APPLICATIONS OR PRIORITY CLAIM

This application is a national phase of International Application No. PCT/FR2005/051139 entitled "Method For Transferring A Circuit To A Grounding Plane", which was filed on Dec. 22, 2005, which was not published in English, and which claims priority of the French Patent Application Nos. 04 53229 filed Dec. 24, 2004.

STATE OF THE PRIOR ART

The invention concerns the formation of novel structures for semi-conductor components or MEMS type devices, and particularly SOI or SOI type devices.

Numerous Microsystems or MEMS (Micro Electro Mechanical Systems) are formed by means of SOI (Silicon On Insulator) materials that make it possible in particular to obtain membranes of monocrystalline silicon-suspended above a cavity.

SOI type materials are structures composed of a superficial layer 2 in monocrystalline silicon on an insulator layer 4, in general in silicon oxide (FIG. 1). These structures are obtained for example by assembly by molecular adhesion of a wafer 6 of silicon oxidised on the surface, with another wafer of silicon.

This assembly comprises a step of surface preparation of two wafers, a step of bringing into contact and a step of heat treatment. Conventionally, this heat treatment is carried out at temperatures between, typically, 900° and 1250° C. for 2 h.

Then, at least one of the two wafers is thinned, leaving behind a thin semi-conductor layer 2 on an insulator layer 4.

The thinning may take place by different mechanical or chemical means, or by separation at the level of a brittle layer created for example by ion implantation.

For certain applications, it is profitable to obtain circuits on a metallic ground plane.

In the case of SOI circuits, one aims for instance to properly control the density of the carriers on the rear face of the circuit, itself formed in the superficial layer 2.

To achieve this, it is necessary that the SOI circuit, formed in the layer 2 and superficial to the buried layer 4, of low thickness (for example a layer of silicon oxide), is such that the array constituted by said circuit and the buried layer 4 is on an electrically conducting layer, or metallic ground plane. To do this it is profitable to have a buried oxide of very low thickness, for example 10 nm to 50 nm. It is thereby possible to control the density of the carriers in the layer of the semi-conductor in the vicinity of the interface by the intermediary of the potential difference applied to the conducting buried layer and to the semi-conducting layer.

However, it is difficult to obtain SOI wafers with a thin dielectric layer 4 and a metallic ground plane, because the wafers could not then undergo heat treatments at high temperature necessary for the formation of circuits or components.

One may on the other hand transfer, after formation of circuits on SOI material, the circuits onto wafers containing a metallic ground plane. One possibility is to transfer the layer containing the circuits onto a layer with a metallic deposition by double transfer techniques using molecular adhesion.

But from a technological point of view, this is difficult to implement, because it is difficult to have a direct bonding between a metallic layer and an oxide, especially when this is of low thickness, without having bonding defects.

The problem is therefore posed of being able to form a structure comprising a SOI type circuit or comprising a layer of circuits on a buried layer and a ground plane under this circuit or this buried layer.

DESCRIPTION OF THE INVENTION

The invention firstly concerns a method for forming a semi-conducting structure, comprising:

a) the formation of at least all or part of a component or a circuit, in or on the superficial layer of a substrate, comprising said superficial layer, a buried layer underneath the superficial layer, and an underlying layer serving as first support, b) a transfer of this substrate onto a handle substrate, and then an elimination of the first support, c) the formation of a layer forming a ground plane on the buried layer, d) the formation, on the layer forming a ground plane, of a bonding layer, e) a transfer of the structure thus obtained onto a second support and an elimination of the handle substrate.

In this first case, the bonding layer may be electrically insulating, for example chosen among SiO2, Si3N4, SiON or other. It may also be electrically conducting, for example in doped Si or in doped polycrystalline Si.

The invention further concerns a method for forming a semi-conducting structure, comprising:

a) the formation of at least all or part of a component or a circuit, in or on the superficial layer of a substrate, comprising said superficial layer, a buried layer underneath the superficial layer, and an underlying layer serving as first support, b) a transfer of this substrate onto a handle substrate, then an elimination of the first support, c) the formation of a layer in heavily doped semi-conductor material, forming both bonding layer and electrically conducting layer or ground plane on the buried layer, d) a transfer of the resulting structure onto a second support and an elimination of the handle substrate.

According to the invention, one forms a circuit on a substrate comprising a superficial layer, a buried layer, for example in silicon oxide, thick or thin, underneath the superficial layer, and a first support.

This structure is then assembled on a wafer, for example in semi-conductor, which acts as a handle.

One may then thin the substrate, so as to eliminate the first support up to the level of the buried layer.

This step of thinning may be carried out for example by mechanical thinning and/or chemical attack.

In the first case, the layer forming a ground plane may be in a metallic material or in a heavily doped semi-conductor material. Its lateral extension may be limited, and it may therefore only cover part of the buried layer. In the second case, the layer forming a ground plane also forms a bonding layer.

The transfer step may be carried out by molecular adhesion or by bonding by means of an adhesive substance such as an adhesive, a resin, etc.

After the step b), a step of thinning of the buried layer of the substrate may be carried out, for example by mechanical and/or chemical means (wet or dry). One may therefore adapt the thickness of the buried layer to the desired thickness.

The superficial layer may be in semi-conductor material, for example in silicon or in germanium, or in a III-V, II-VI semi-conductor, or in a mixed semi-conductor, for example in SiGe.

The initial substrate may be a SOI substrate.

The component or circuit may be an electronic or optoelectronic or MEMS type component.

The invention further concerns a semi-conductor device comprising a superficial layer of circuits or components, a first buried layer in a dielectric material, a second buried layer forming conducting layer or ground plane, if necessary of limited lateral extension, a third buried bonding layer, and a substrate.

The layer forming a ground plane may be in a metallic material or in heavily doped semi-conductor.

The invention further concerns a semi-conductor device comprising a superficial layer of circuits or components, a first buried layer in a dielectric material, a second buried layer in a heavily doped semi-conductor material, forming both bonding layer and electrically conducting layer, or ground plane, and a substrate.

In both cases, the superficial layer, in which are formed the circuits, may be in semi-conductor, for example in silicon or in germanium, or in a III-V, II-VI semi-conductor, or in a mixed semi-conductor, for example in SiGe.

The first buried layer may be an electrical insulator, such as silicon dioxide, or thermal silica or a multilayer for example of SiO2/Si3N4 type.

DETAILED DESCRIPTION OF SPECIFIC EMBODIMENTS

Figure 2:
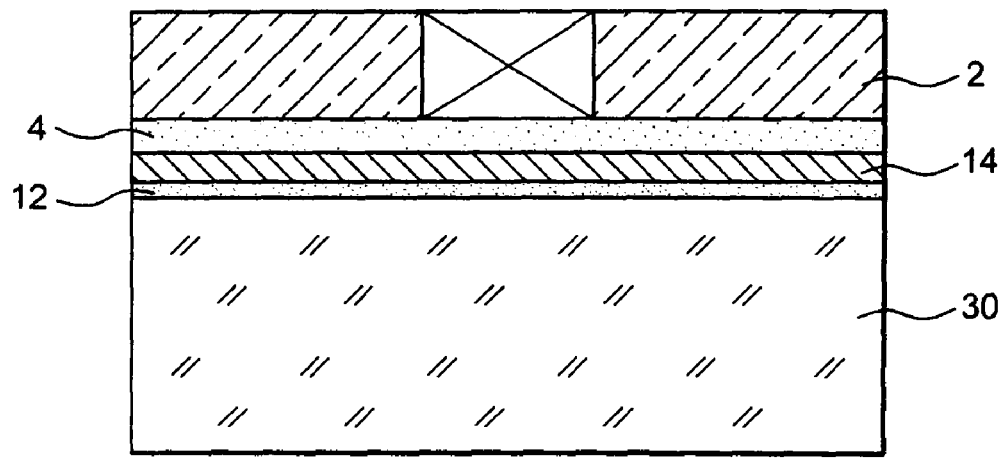
FIG. 2 represents a component according to the invention.

FIG. 2 represents a device or component according to the invention, comprising, on a substrate 30, a bonding layer 12, a layer 14 forming a ground plane, a dielectric layer 4 and finally a layer 2 of circuits.

The layer 2-layer 4 array forms an "SOI circuit".

Figure 5:
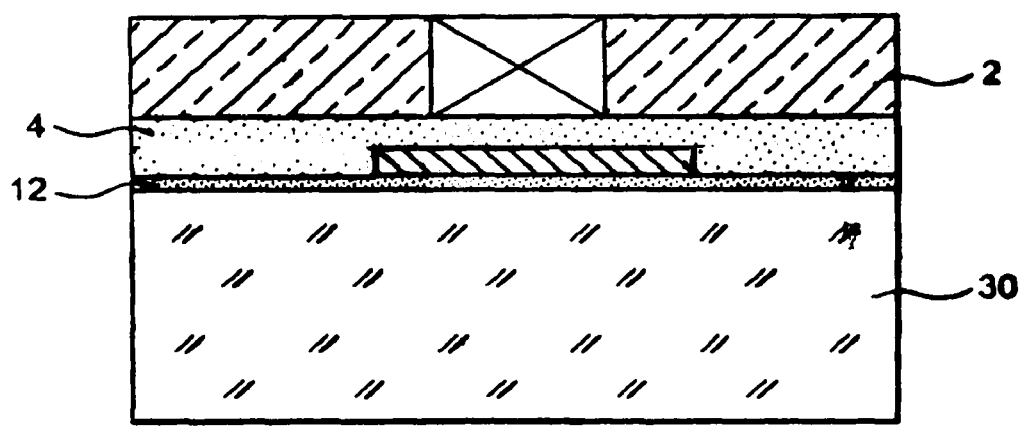
FIG. 5 represents a component according to the invention.

The layer 14 may be metallic or in heavily doped semi-conductor material (for example in silicon). This layer may be only local and not uniform or continuous, for example it may be under certain components only (FIG. 5).

The bonding layer 12 may be electrically insulating; this may be an oxide, for example SiO2. It may also be chosen among, for example, Si3N4, SiON or other.

It may also be electrically conducting, then being for example in doped amorphous Si or in doped polycrystalline Si, or even in doped Si.

The bonding interface may be localised between the bonding layer 12 and the substrate support 30. This interface may also, in the case where a bonding layer is deposited both on the ground plane and on the support 30, be localised in the middle of the bonding layer itself.

By way of example, the layer 4 has a thickness for example between 10 nm and 500 nm or 1 µm, and the layer 2 a thickness between 10 nm and 1 µm or 10 µm. The metallic layer may have a thickness between 100 nm and 500 nm, and the bonding layer a thickness between 500 nm and several µm, for example 5 µm. All of these thickness ranges can vary outside of the ranges indicated.

If there is a topology on the rear face (ground plane 14 side) it may be advantageous to carry out a planarisation before the step of bonding or before the deposition of the conducting layer.

A method for forming such a component will now be described, while referring to FIGS. 3A to 3G.

Figure 1:
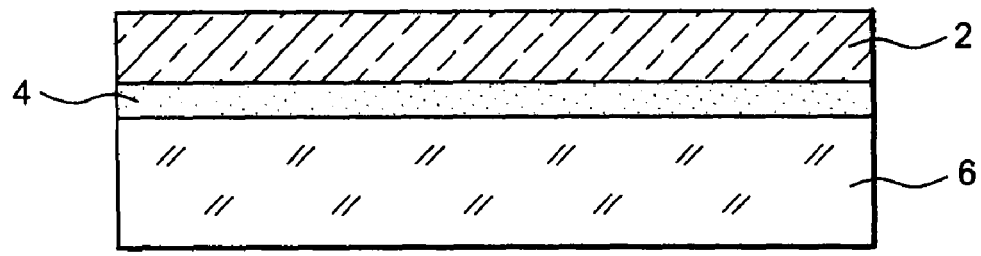
FIG. 1 represents a SOI structure.

A SOI wafer initially comprises, as illustrated in FIG. 1, a support 6, a buried layer 4 and a superficial layer 2. This latter layer is for example in silicon, but it can also be in germanium, or in a III-IV, II-VI semi-conductor, or in a mixed semi-conductor, such as SiGe for example.

On this SOI wafer (FIG. 3A), one forms circuits 18 or all or part of a component in the layer 2.

The array is then assembled (FIG. 3B), by the side of the layer 2 of circuits, with a handle substrate 20, by bonding for example by molecular adhesion. Such bonding has the advantage of being compatible with thermal methods, at more or less high temperatures, unlike bonding with adhesive or resins.

Figure 3A:
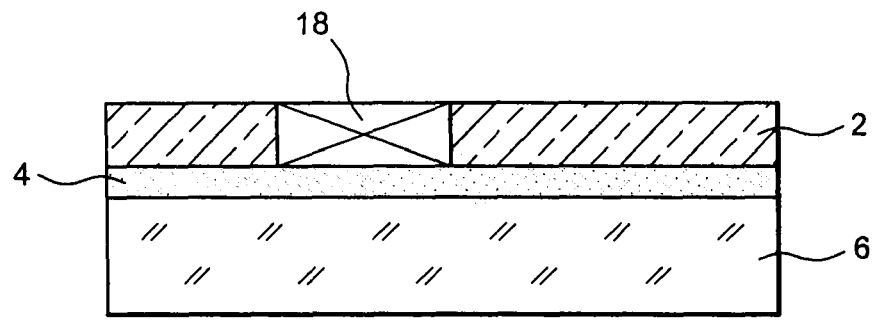
FIGS. 3A-3E represent the steps of a method according to the invention.
Figure 3B:
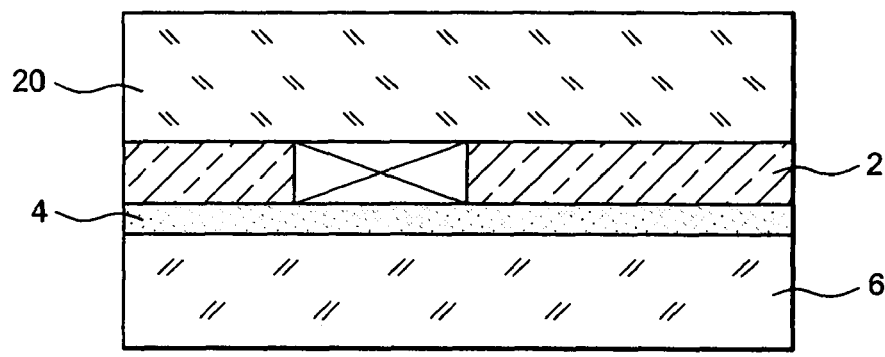
Figure 3C:
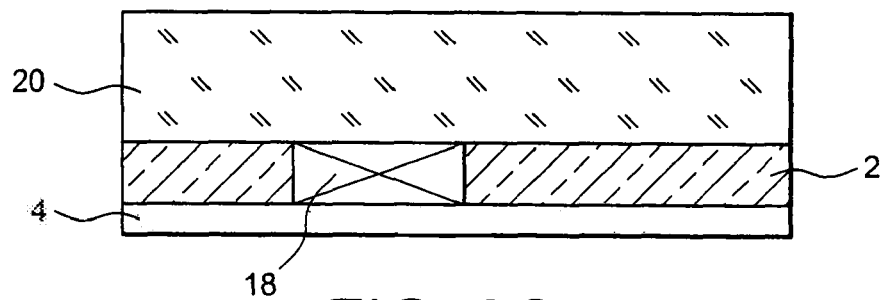
Figure 3D:
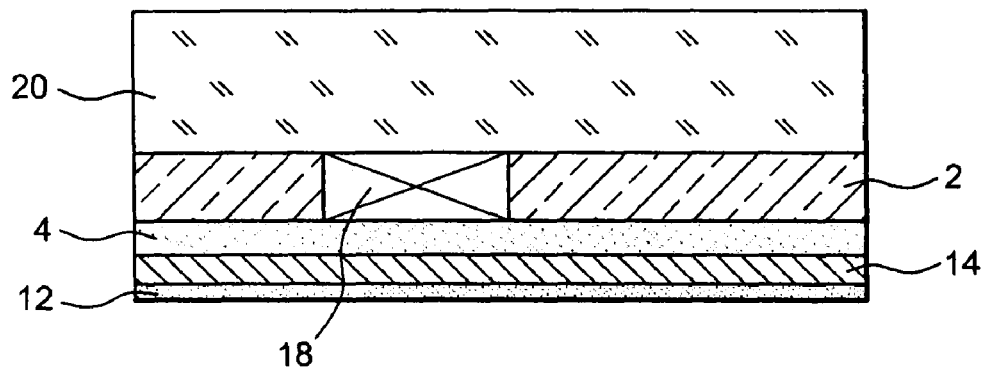

The support 6 may then be eliminated for example by mechanical, and/or mechanical-chemical, and/or chemical thinning (FIG. 3C).

One may then adapt the thickness of the buried layer 4 to the desired thickness. This step makes it possible to properly control the effect of the conducting layer through the dielectric layer 4.

The thinning of this layer 4 is in a preferential manner carried out by CMP (chemical mechanical polishing) or by chemical attack (wet or dry etching) down to low thickness, for example from 10 nm to 50 nm.

One then forms, on the layer 4, a conducting layer 14 (FIG. 3D), for example by gas phase chemical deposition. This layer may be for example in copper, or in aluminium or in doped silicon, or in tungsten silicide (WSi2).

This layer may cover the entire surface or be localised according to patterns for the needs of the application; one then uses lithographic and etching techniques to delimit the zones with this conducting layer and the zones without this conducting layer. For instance, the conducting layer may be only local, for example under certain components.

On this conducting layer 14, another layer 12 in a material making it possible to facilitate a bonding on a substrate, particularly of semi-conductor type, may be deposited or formed. This bonding layer 12 is for example a layer of silicon oxide or a layer of amorphous or polycrystalline silicon. Depending on the nature of the bonding layer, there may therefore be electrical conduction between the ground plane and the substrate or an electrical insulation. In the case of an electrical insulation, the contact of the conducting layer may be taken by the front face or by the rear face of the structure. In the case of a conducting bonding layer, the contact may be taken by the rear face.

This bonding layer 12 may be a thick layer, for example greater than 100 nm, which makes it possible to obtain a good quality of bonding.

The fact of placing a bonding layer on the ground plane makes it possible to free oneself of the characteristics of the conducting layer 14, in particular of the thickness, and/or the roughness of said layer.

Figure 3E:
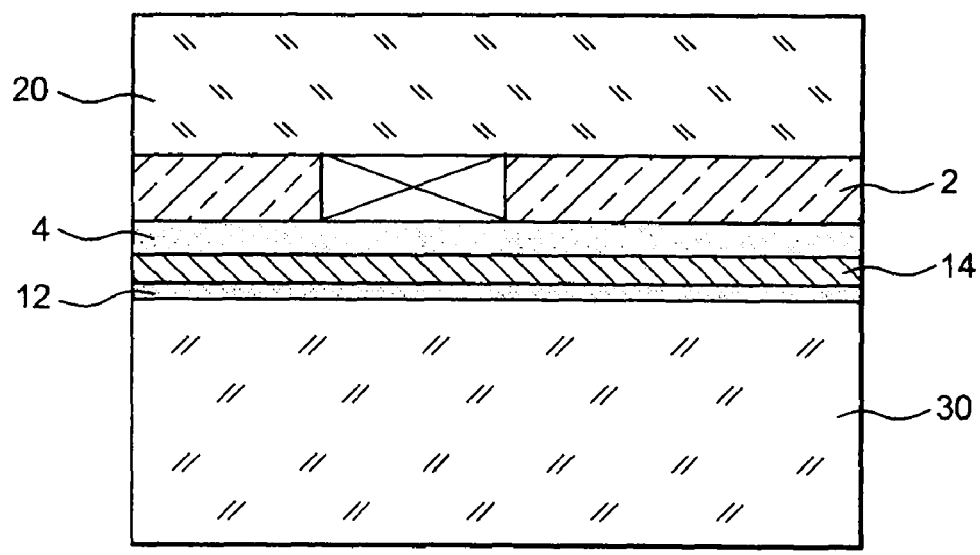

It is then possible to transfer the array, for example by bonding by molecular adhesion onto another substrate 30 (FIG. 3E). If a topology is present on the rear face (on the side to assemble with the substrate 30), a planarisation may be carried out.

For instance, one may easily transfer the structure by assuring a good control of the bonding, the bonding by molecular adhesion making it possible to assure no or few defects and a high bonding energy. Moreover, it is compatible with the carrying out of subsequent microelectronic steps. One may also use a bonding by means of an adhesive substance, such as a glue or a resin.

After this transfer step, the handle wafer 20 that served as manipulator to thin the initial wafer may be eliminated, for example by mechanical and/or chemical thinning or by disbanding at the level of the bonding interface between front face and handle.

One has for instance a structure such as that of FIG. 2 with SOI circuits containing a thin oxide 4 on a ground plane 14.

The whole lies on a layer 12 that has made it possible to assure the bonding of the structure on a new support 30.

Figure 4:
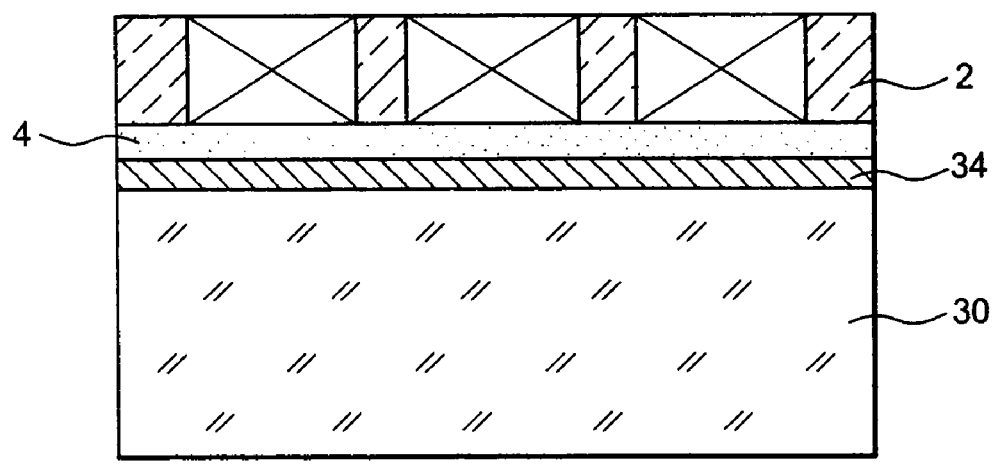
FIG. 4 represents another component according to the invention.

FIG. 4 represents another component according to the invention, comprising, on a substrate 30, a layer 34 in heavily doped semi-conductor material, forming a ground plane and bonding layer, a dielectric layer 4 and finally a layer 2 of circuits. The doping of the layer 34 enables the resistivity of said layer to be at the most around several $m\Omega/cm^2$, for example at the most around 10 $m\Omega/cm^2$ or 100 $m\Omega/cm^2$. It is for example a layer of doped polysilicon.

The layer 2-layer 4 array forms a "SOI type circuit".

The formation of such a device may be described while referring to FIGS. 3A-3E: the steps are the same, except for the formation of the metallic layer 14 and the bonding layer 12, which are replaced by a unique layer 34.

The invention claimed is:

1. Method for forming a semi-conducting structure, comprising:
   a) the formation of at least one part of a circuit or a component, in or on a superficial layer of a substrate, the substrate including a buried layer underneath the superficial layer, and an underlying layer serving as first support, wherein the superficial layer is formed to cover entirely a surface of the buried layer,
   b) a transfer of said substrate onto a handle substrate, and then an elimination of the first support,
   c) the formation of an electrically conducting or ground plane forming layer, on at least one part of a bottom surface of said buried layer, wherein the buried layer is formed to insulate the electrically conducting or ground plane forming layer from the superficial layer and the circuit or the component,
   d) the formation, on said electrically conducting or ground plane forming layer, of a bonding layer, wherein the bonding layer is formed to have a thickness greater than the buried layer,
   e) a transfer of the structure obtained onto a second support and an elimination of said handle substrate, and
   f) after step b), thinning the buried layer.

2. Method according to claim 1, said bonding layer being electrically insulating.

3. Method according to claim 2, wherein said bonding layer is selected from a group of SiO2, Si3N4, or SiON.

4. Method according to claim 1, wherein said bonding layer is electrically conducting and is selected from a group of a doped semi-conductor, a doped Si or a doped polycrystalline Si.

5. Method according to claim 1, said conducting or ground plane forming layer being in a metallic material or in a heavily doped semi-conductor material.

6. Method according to claim 1, said electrically conducting or ground plane forming layer being formed locally, without entirely covering the bottom surface of said buried layer.

7. Method according to claim 1, said step e) or d) of transfer being carried out by molecular adhesion.

8. Method according to claim 1, said superficial layer being of a semi-conductor material selected from at least one of silicon , germanium, a III-V, II-VI semi-conductor, SiGe, or a mixed semi-conductor.

9. Method according to claim 1, said substrate being a SOI substrate.

10. Method according to claim 1, wherein the buried layer is formed to have a thickness less than 50 nanometers.

11. Method for forming a semi-conducting structure, comprising:
    a) the formation of at least one part of a circuit or a component, in or on a superficial layer of a substrate, the substrate including a buried layer underneath the superficial layer, and an underlying layer serving as first support, wherein the superficial layer is formed to cover entirely a surface of the buried layer,
    b) a transfer of said substrate onto a handle substrate, and then an elimination of said first support,
    c) the formation of a bonding and ground plane forming layer on at least one part of a bottom surface of the buried layer, wherein the bonding and ground plane forming layer is made of a heavily doped semi-conductor material, wherein the bonding and ground plane forming layer is formed to have a thickness greater than the buried layer and the buried layer is formed to insulate the bonding and ground plane forming layer from the superficial layer and the circuit or the component,
    d) a transfer of the structure obtained after step c) onto a second support and an elimination of said handle substrate.

12. Method according to claim 11, said step d) of transfer being carried out by molecular adhesion.

13. Method according to claim 11, further comprising, after said step b), a step of thinning of the buried layer.

14. Method according to claim 11, said superficial layer being of a semi-conductor material selected from at least one of silicon , germanium, a III-V, II-VI semi-conductor, SiGe, or a mixed semi-conductor.

15. Method according to claim 11, wherein said substrate is a SOI substrate.

16. Method according to claim 11, wherein the buried layer is formed to have a thickness less than 50 nanometers.

17. Method for forming a semi-conducting structure, comprising:
    a) forming at least one part of a circuit or a component, in or on a superficial layer of a substrate, the substrate including a buried layer underneath the superficial layer, and an underlying layer serving as first support, wherein the superficial layer is formed to cover entirely a surface of the buried layer,
    b) transferring the substrate onto a handle substrate,
    c) eliminating the first support,
    d) forming an electrically conducting or ground plane forming layer on a bottom surface of the buried layer, wherein the buried layer is formed to insulate the electrically conducting or ground plane from the superficial layer and the circuit or the component,
    e) forming a bonding layer on the electrically conducting or ground plane forming layer, wherein the bonding layer is formed to have a thickness greater than the buried layer,
    f) transferring the structure obtained onto a second support,
    g) eliminating the handle substrate, and
    h) after step b), thinning of the buried layer.

18. Method according to claim 17, wherein said bonding layer being electrically insulating.

19. Method according to claim 17, wherein said bonding layer is selected from a group of SiO2, Si3N4, or SiON.

20. Method according to claim 17, wherein said bonding layer is electrically conducting and is selected from a group of a doped semi-conductor, a doped Si or a doped polycrystalline Si.

21. Method according to claim 17, said conducting or ground plane forming layer being in a metallic material or in a heavily doped semi-conductor material.

22. Method according to claim 17, said electrically conducting or ground plane forming layer being formed locally, without entirely covering the bottom surface of said buried layer.

23. Method according to claim 17, said step e) or d) of transfer being carried out by molecular adhesion.

24. Method according to claim 17, said superficial layer being of a semi-conductor material selected from at least one of silicon, germanium, a III-V, II-VI semi-conductor, SiGe, or a mixed semi-conductor.

25. Method according to claim 17, said substrate being a SOI substrate.

26. Method according to claim 17, wherein the buried layer is formed to have a thickness less than 50 nanometers.

* * * * *